(12) United States Patent
Lee (10) Patent No.: US 7,859,445 B1
(45) Date of Patent: Dec. 28, 2010

(54) DIGITAL TO ANALOG CONVERTER

(75) Inventor: Ching-Chung Lee, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 13 days.

(21) Appl. No.: 12/491,421

(22) Filed: Jun. 25, 2009

(51) Int. Cl.
*H03M 1/66* (2006.01)

(52) U.S. Cl. ...................................... 341/145; 341/144

(58) Field of Classification Search ................ 341/144, 341/145, 154, 153, 120
See application file for complete search history.

(56) References Cited

U.S. PATENT DOCUMENTS 7,006,027 B2 * 2/2006 Lan et al. .................... 341/144

2002/0121995 A1 * 9/2002 Tabler ........................ 341/145

* cited by examiner

*Primary Examiner*—Brian Young
(74) *Attorney, Agent, or Firm*—Thomas, Kayden, Horstemeyer & Risley (57) ABSTRACT

An embodiment of a digital to analog converter (DAC) with two outputs is provided. The DAC is controlled by an n-bits input signal and comprises a reference voltage circuit generating (2n+1) reference voltages, a first switch array and a second switch array. The first switch array receives and outputs $2^n$ selected reference voltages among the ($2^n$+1) reference voltages to the second switch array. The second switch array outputs a first voltage via a first output terminal and a second voltage via a second output terminal according to the input signal, wherein the ($2^i$+1)th reference voltages are directly transmitted to the second switch array, and when the first bit of the input signal is at a first voltage level, the first voltage is transmitted to the second output terminal, and the second voltage is transmitted to the first output terminal.

12 Claims, 7 Drawing Sheets

DIGITAL TO ANALOG CONVERTER

BACKGROUND OF THE INVENTION

1. Field of the Invention

The invention relates to a digital to analog converter, and more particularly to a digital to analog converter with reduced number of switches.

2. Description of the Related Art

Digital to analog converters are widely used in mixed-mode systems where the converter acts as an interface between the digital signal processing and analog signal processing components of mixed-mode systems.

Figure 1:
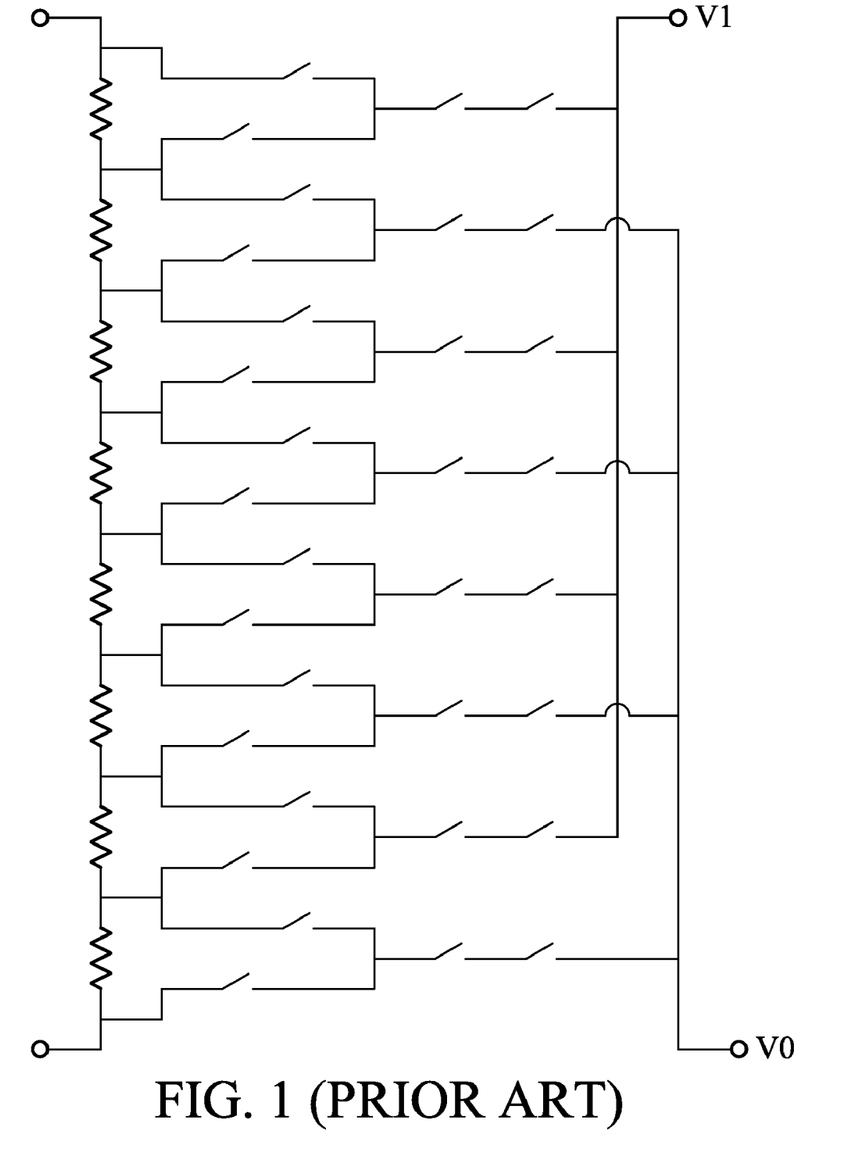
FIG. 1 is a circuit diagram of a conventional $2^3$-to-2 digital to analog converter.

FIG. 1 is a circuit diagram of a conventional $2^3$-to-2 digital to analog converter. The converter is controlled by a 3-bits input signal, and the output voltages V0 and V1 are determined according to the input signal. The converter requires $3 \times 2^3 + 2^3$ switches for implementation. In other words, a conventional $2^N$-to-2 digital to analog converter requires $N \times 2^N + 2^N$ switches for implementation. If N is 10, the number of digital to analog converters is large and the layout area accordingly is large.

Figure 7:
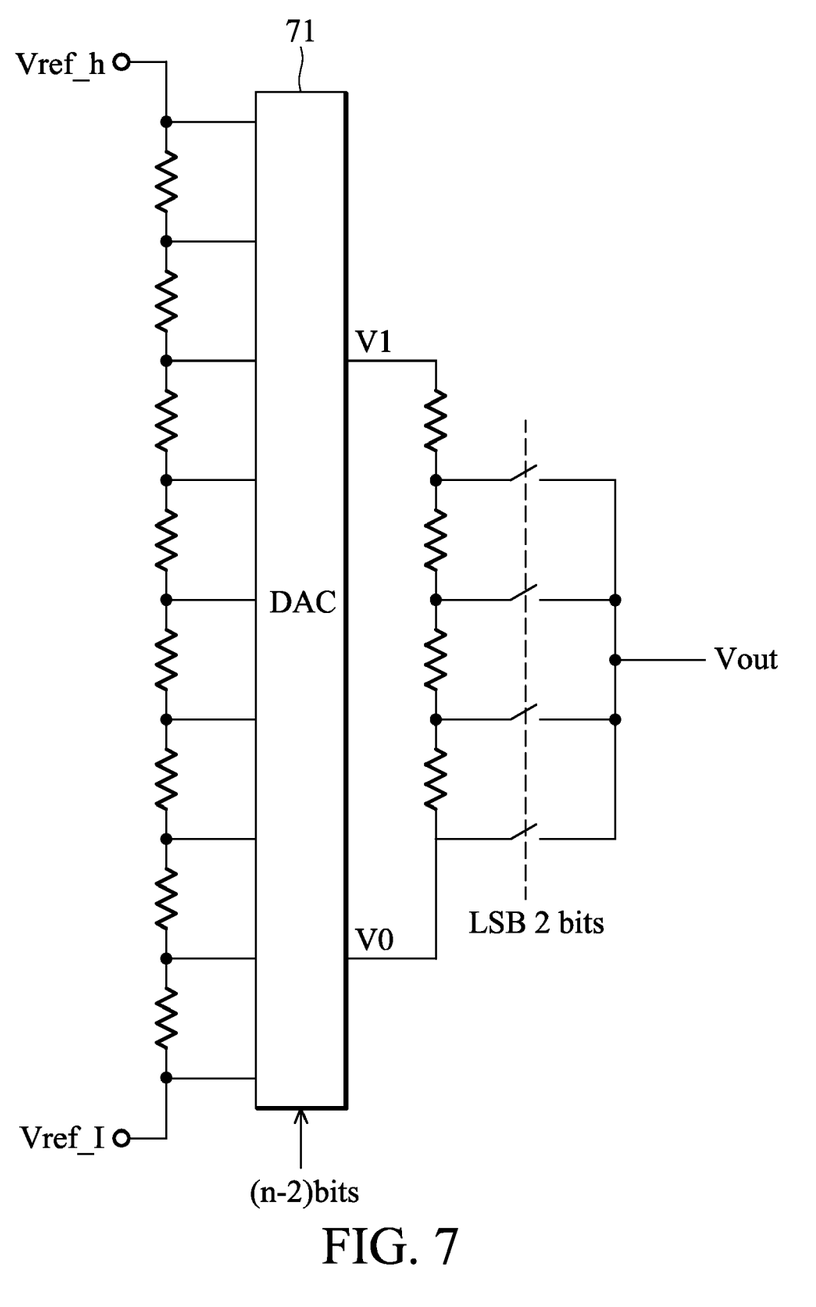
FIG. 7 is a schematic diagram of a general architecture of a two stage N to 1 digital to analog converter.

FIG. 7 is a schematic diagram of a general architecture of a two stage N to 1 digital to analog converter. The two stage digital to analog converter comprises a first digital to analog converter (DAC) 71 controlled by (n−2) bits and a second stage with four switches controlled by the LSB (least significant bit) 2 bits. The DAC 71 outputs two voltages according to the most (n−2) bits, and then LSB 2 bits control the four switches to output the output voltage Vout. Since the traditional architecture DAC 71 requires a large number of switches and this occupies large layout area. Therefore, the present innovation provides architecture of the DAC 71 that requires fewer switches.

BRIEF SUMMARY OF THE INVENTION

An embodiment of digital to analog converter (DAC) with two outputs is provided. The DAC is controlled by an n-bits input signal and comprises a reference voltage circuit, a first switch array, a second switch array and a switch circuit. The reference voltage circuit generates ($2^n+1$) reference voltages. The first switch array receives and outputs $2^n$ selected reference voltages among the ($2^n+1$) reference voltages according to the first bit of input signal. The second switch array receives the $2^n$ selected reference voltages and outputting a first voltage of the selected reference voltages via a first output terminal and a second voltage of the selected reference voltages via a second output terminal according to the bits of input signal except for the first bit, wherein all (2i+1)th reference voltages are directly transmitted to the second switch array, and (2i+1) is the odd number between 0 and $2^n$. The switch circuit outputs the first voltage and the second voltage.

Another embodiment of the invention provides a digital to analog converter with two outputs. The digital to analog converter is controlled by an n-bits input signal and comprises a first output terminal, a second output terminal, a reference voltage circuit, a first digital to analog converting unit, a second digital to analog converting unit. The reference voltage circuit generates ($2^n+1$) reference voltages. The first digital to analog converting unit receives (2i+1)th reference voltages and outputs a first voltage, wherein (2i+1) is the odd number between 0 and $2^n$. The second digital to analog converting unit receives the (2i)th reference voltages and output a second voltage, wherein 2i is the even number between 0 and $2^n$. The first digital to analog converting unit is controlled by the n-bits input signal except for a first bit of the n-bits input signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
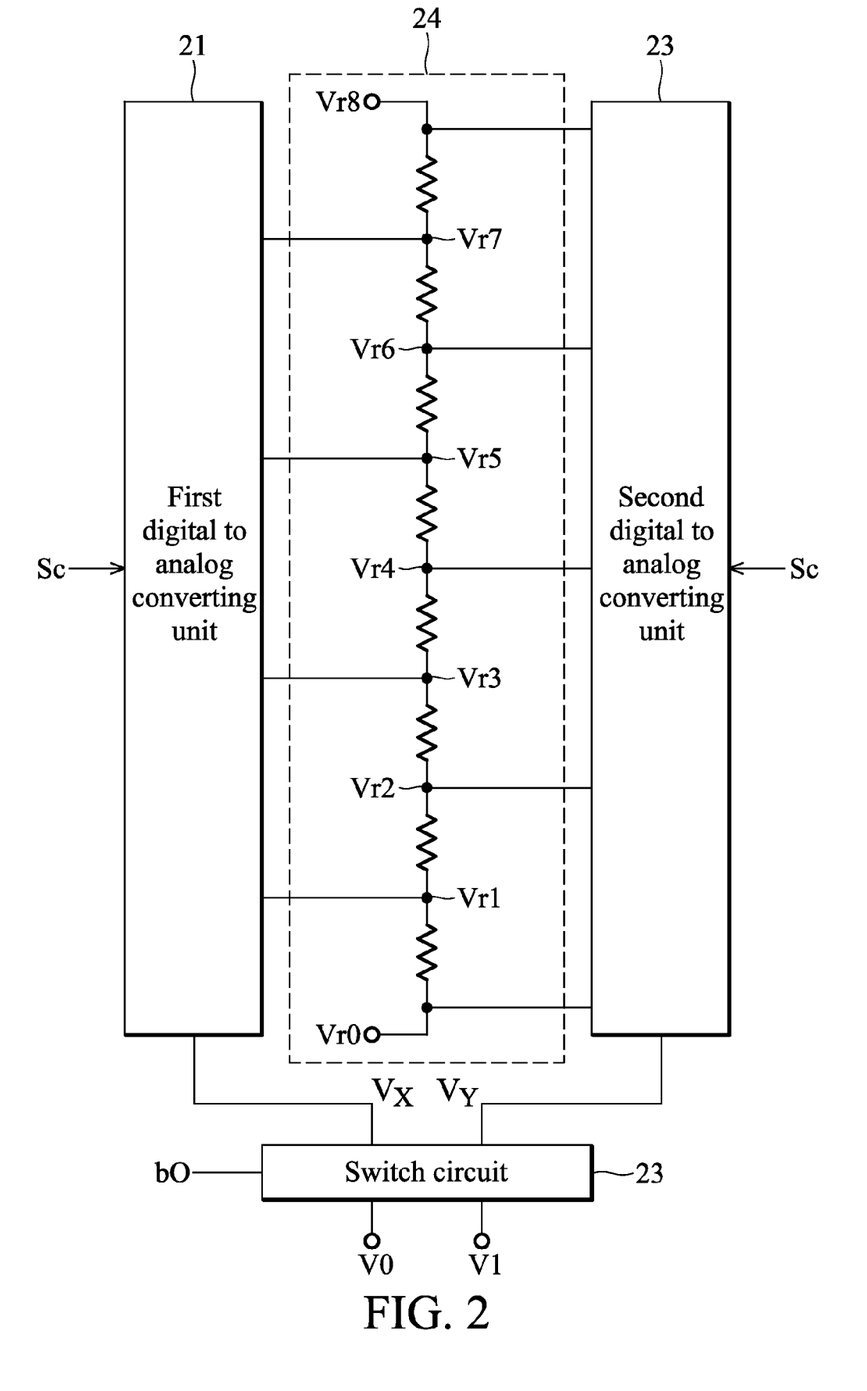
FIG. 2 is a schematic diagram of an embodiment of a digital-to-analog converter according to the invention.

FIG. 2 is a schematic diagram of an embodiment of a digital-to-analog converter according to the invention. The converter comprises a first digital to analog converting unit 21, a reference voltage generator 24, a second digital to analog converting unit 22, and a switch circuit 23. The first digital to analog converting unit 21 and the second digital to analog converting unit 22 are controlled by a input signal Si. The embodiment of FIG. 3 is illustrated using a $2^3$-to-2 digital to analog converter, however, the invention is not limited thereto.

The first digital to analog converting unit 21 receives the reference voltages Vr7, Vr5, Vr3, and Vr1 and outputs a selected voltage Vx according to a input signal Sc. The second digital to analog converting unit 22 receives the reference voltages Vr8, Vr6, Vr4, Vr2 and Vr0 and outputs a selected voltage $V_Y$ according to the input signal Sc. The input signal Sc comprises three bits, b0, b1 and b2. The switch circuit 23 outputs two voltages V0 and V1. When the first bit b0 (Least Significant Bit, LSB) of the input signal Sc is 1, the voltage V0 is the selected voltage Vx, and the voltage V1 is the selected voltage $V_Y$. When the first bit of the input signal Sc is 0, the voltage V1 is the selected voltage Vx, and the voltage V0 is the selected voltage $V_Y$.

In FIG. 2, The odd reference voltages, such that Vr1, Vr3, Vr5, Vr7, are directly transmitted to the first digital to analog converting unit 21 and the first digital to analog converting unit 21 is only controlled by two bits, b1 and b2, of the input signal. The even reference voltages, such that Vr0, Vr2, Vr4, Vr6 and Vr8, are transmitted to the second digital to analog converting unit 22, and the second digital to analog converting unit 22 is controlled by all bits of the input signal.

Figure 3:
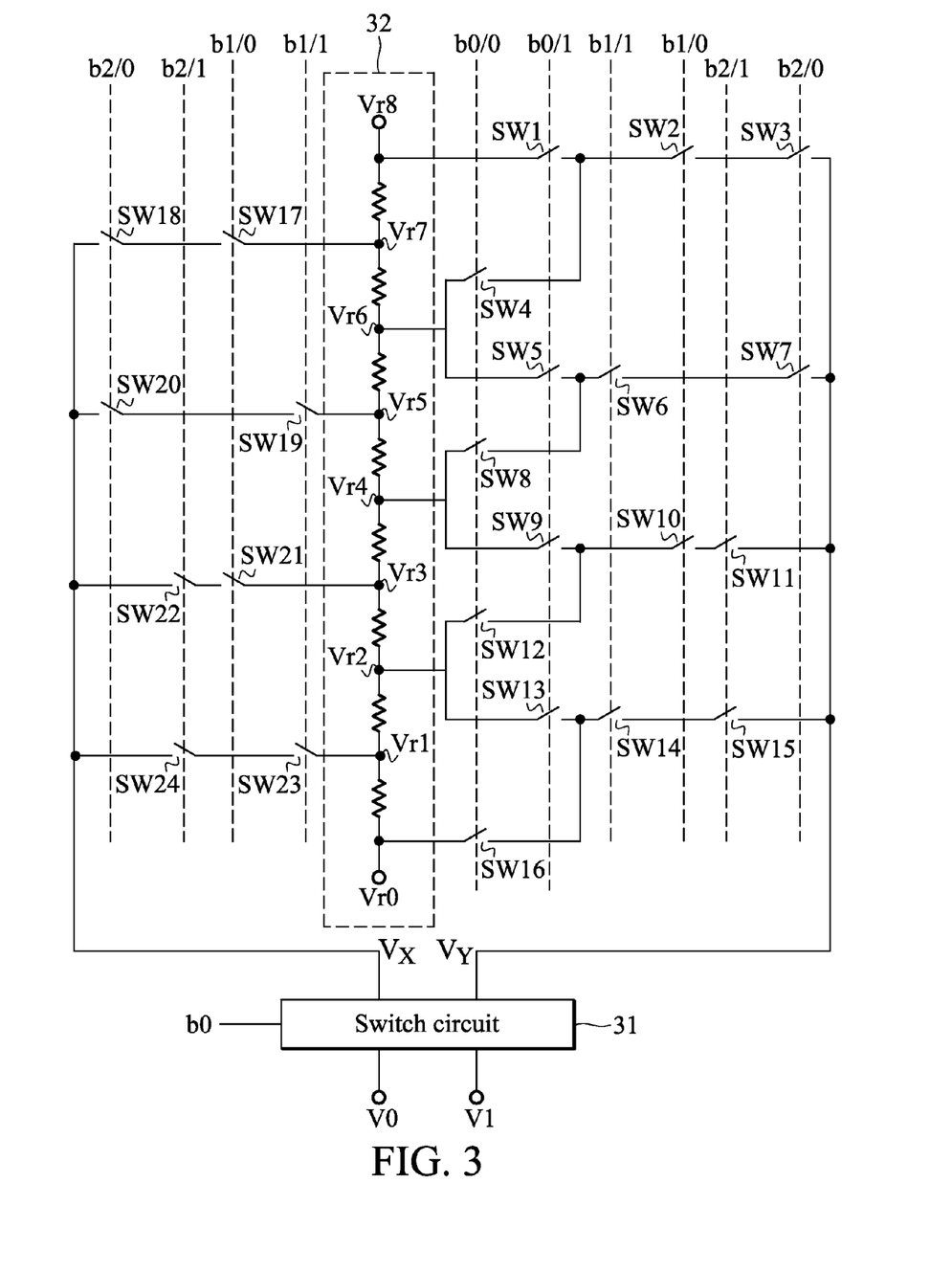
FIG. 3 is a schematic diagram of another embodiment of digital-to-analog converter according to the invention.

FIG. 3 is a schematic diagram of another embodiment of digital-to-analog converter according to the invention. The detailed circuit connection is not described here for brevity. The switches in FIG. 3 are controlled by a input signal. The input signal comprises three bits, b0, b1 and b2. In FIG. 3, the odd reference voltages, such as Vr1, Vr3, Vr5, Vr7, are only determined by two bits of the input signal, thus, the number of switches can be reduced.

The switches SW4, SW8, SW12 and SW 16 are turned on when the first bit (least significant bit) b0 is 0. The switches SW1, SW5, SW9 and SW13 are turned on when the first bit b0 is 1. The switches SW2, SW 17, SW10 and SW21 are turned on when the second bit b1 is 1. The switches SW6, SW 19, SW14 and SW23 are turned on when the second bit b1 is 0. The switches SW3, SW 18, SW7 and SW20 are turned on when the third bit (most significant bit) b2 is 1. The switches SW11, SW 22, SW15 and SW24 are turned on when the third bit (most significant bit) b2 is 0. When the first bit b0 is 0, the switch circuit 31 directs the voltage Vx to V1, and voltage $V_Y$ to V0. When the first bit b0 is 1, the output voltage V0 is the voltage Vx and the output voltage V1 is the voltage $V_Y$.

Table 1 is a truth table of the digital-to-analog converter of FIG. 3.

TABLE 1

| Input signal | | | Without switch circuit | | With switch circuit | |
|---|---|---|---|---|---|---|
| b0 | b1 | b2 | $V_X$ | $V_Y$ | V0 | V1 |
| 0 | 0 | 0 | Vr1 | Vr0 | Vr0 | Vr1 |
| 1 | 0 | 0 | Vr1 | Vr2 | Vr1 | Vr2 |
| 0 | 1 | 1 | Vr7 | Vr6 | Vr6 | Vr7 |
| 1 | 1 | 1 | Vr7 | Vr8 | Vr7 | Vr8 |
| 0 | 0 | 1 | Vr5 | Vr4 | Vr4 | Vr5 |
| 1 | 0 | 1 | Vr5 | Vr6 | Vr5 | Vr6 |
| 0 | 1 | 0 | Vr3 | Vr2 | Vr2 | Vr3 |
| 1 | 1 | 0 | Vr3 | Vr4 | Vr3 | Vr4 |

Figure 4:
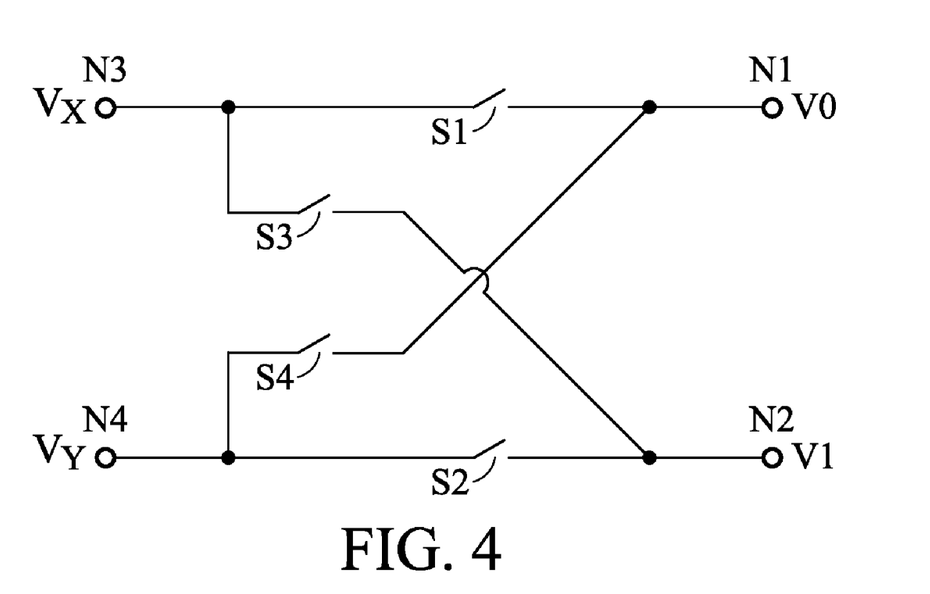
FIG. 4 is a schematic diagram of an embodiment of switch circuit according to the invention.

FIG. 4 is a schematic diagram of an embodiment of switch circuit according to the invention. The switch circuit comprises two output terminals, N1 and N2, respectively outputting voltages V0 and V1. The first switch S1 is coupled between nodes N1 and N3. The second switch S2 is coupled between nodes N2 and N4. The third switch S3 is coupled between nodes N2 and N3. The fourth switch S4 is coupled between nodes N1 and N4. The first switch S1 and the second switch S2 are turned off when the first bit b0 is 0, and the third switch S3 and the fourth switch S4 are turned on when the first bit b0 is 0. When the first bit b0 is 1, the first switch S1 and the second switch S2 are turned on, and the third switch S3 and the fourth switch S4 are turned off.

According to the circuit shown in FIG. 3 and FIG. 4, the proposed $2^3$-to-2 digital-to-analog converter requires only 28 switches, where the conventional $2^3$-to-2 digital-to-analog converter requires 32 switches. If the proposed digital-to-analog converter architecture is applied to a $2^{10}$-to-2 digital-to-analog converter, $(2^{10}-4)$ switches can be saved. This simplifies the of $2^n$-to-2 digital-to-analog converter circuitry and reduces layout area due to the saved switch number.

Figure 5:
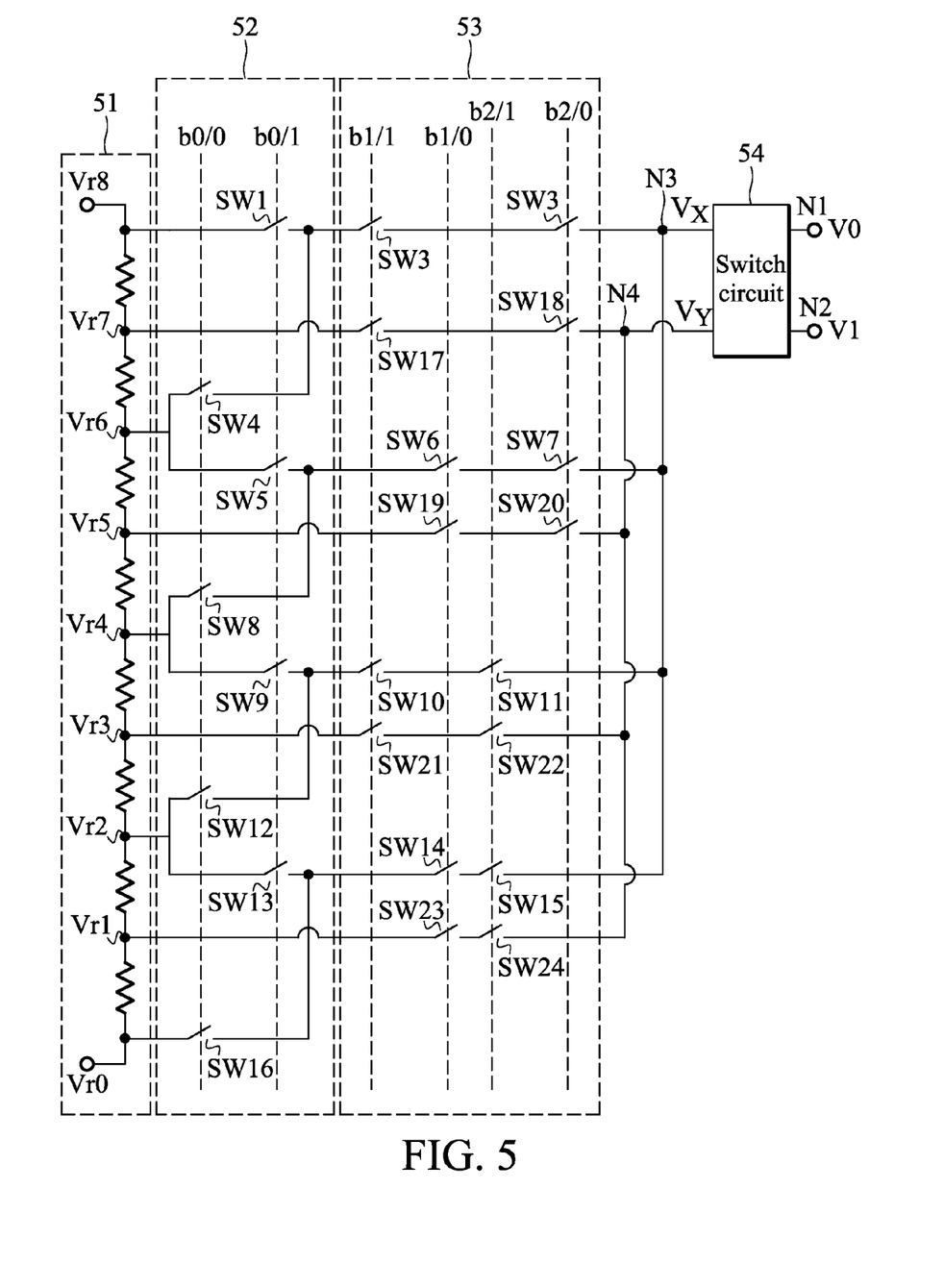
FIG. 5 is a schematic diagram of another embodiment of digital-to-analog converter according to the invention.

FIG. 5 is a schematic diagram of another embodiment of digital-to-analog converter according to the invention. The detailed circuit connection is not described here for brevity. The reference voltage circuit 51 generates ($2^n$+1) reference voltages. The first switch array 52 receives and outputs $2^n$ selected reference voltages of the ($2^2$+1) reference voltages. The second switch array 53 receives the $2^n$ selected reference voltages and outputs a first voltage Vx of the selected reference voltages via a first output terminal N3 and a second voltage $V_Y$ of the selected reference voltages via a second output terminal N4 according to the n-bits input signal.

It is noted that the (2i+1)th reference voltages are directly transmitted to the second switch array without passing through the switches, wherein (2i+1) is the integer number between 0 and $2^n$. Furthermore, only one of the first reference voltage (Vr0) and the $2^3$th reference voltage (Vr8) is transmitted to the second switch array 53 according to the state of the first bit b0 (LSB) of the input signal. In other words, when the first bit b0 of the input signal is 0, only the first reference voltage (Vr0) is transmitted to the second switch array 53, and when the first bit of the input signal is 1, only the $2^n$th reference voltage (Vr8) is transmitted to the second switch array 53.

The switch 54 transmits the voltage Vx and $V_Y$ to the nodes N1 and N2 respectively according to the state of the first bit of the input signal. When the first bit of the input signal is 0, the voltage Vx is transmitted to the node N2, and the voltage $V_Y$ is transmitted to the node N1. When the first bit of the input signal is 1, the voltage Vx is transmitted to the node N1, and the voltage $V_Y$ is transmitted to the node N2.

Figure 6:
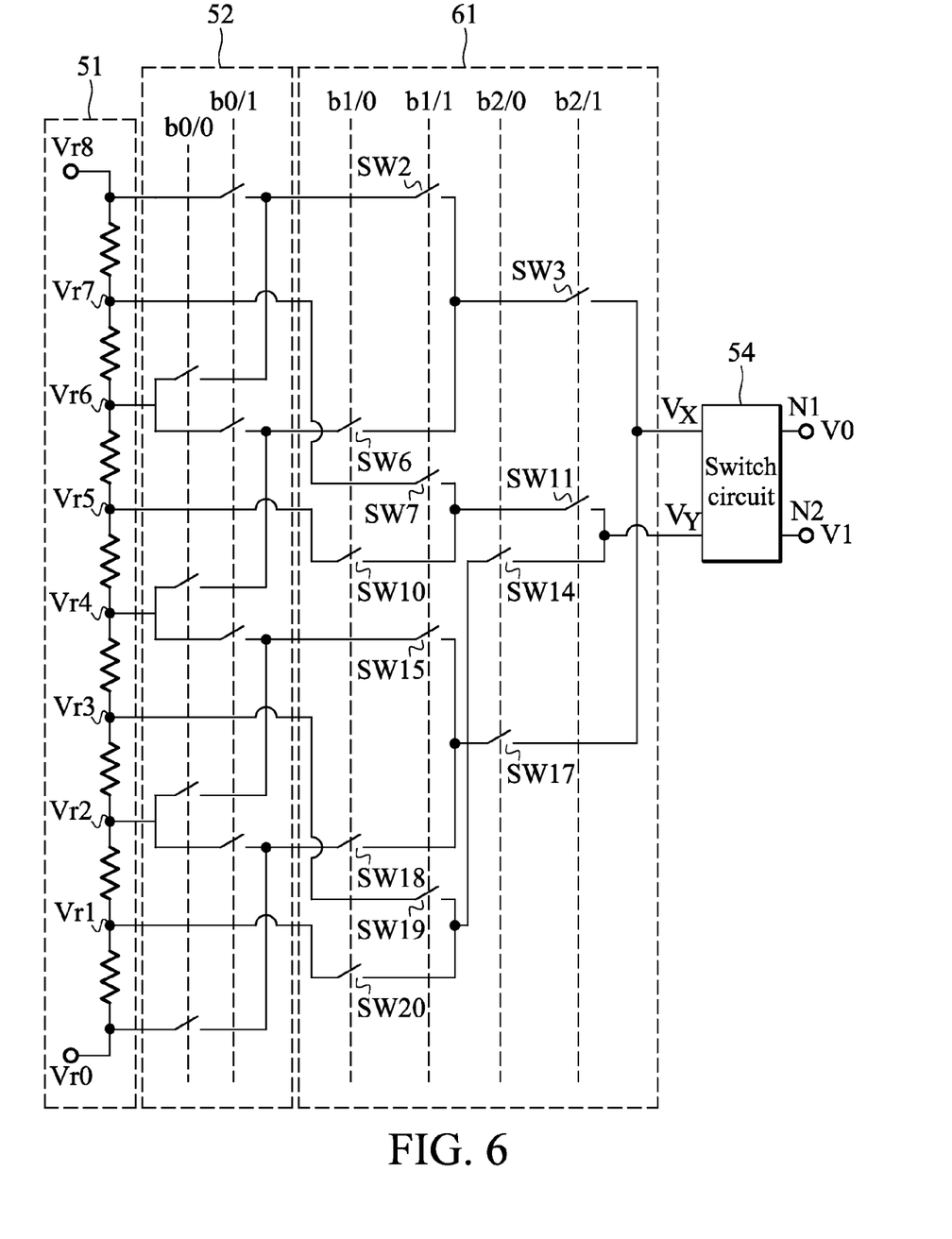
FIG. 6 is a schematic diagram of another embodiment of digital-to-analog converter according to the invention.

FIG. 6 is a schematic diagram of another embodiment of digital-to-analog converter according to the invention. Compared with the circuitry of FIG. 5, the difference is that the second switch array is replaced with a binary switch array. The detailed circuit connections and the operations are not described here for brevity. The digital-to-analog converter in FIG. 6 requires fewer switches than that in FIG. 5. Table 2 shows the required switch number for the conventional $2^n$-to-2 digital to analog converter and the proposed $2^N$-to-2 digital to analog converter.

TABLE 2

| | Number of Switches | | |
|---|---|---|---|
| Bits (n) | Conventional | FIG. 5 | FIG. 6 |
| 3 | 32 | 28 | 26 |
| 4 | 80 | 68 | 50 |
| 6 | 448 | 388 | 194 |
| 8 | 2304 | 2052 | 770 |
| 10 | 11264 | 10244 | 3074 |
| n | $(n + 1) * 2^n$ | $n * 2^n + 4$ | $3 * 2^n + 2$ |

While the invention has been described by way of example and in terms of preferred embodiment, it is to be understood that the invention is not limited thereto. To the contrary, it is intended to cover various modifications and similar arrangements (as would be apparent to those skilled in the art. Therefore, the scope of the appended claims should be accorded the broadest interpretation so as to encompass all such modifications and similar arrangements.

What is claimed is:

1. A digital to analog converter with two outputs, controlled by an n-bits input signal, comprising:

a reference voltage circuit generating ($2^n$+1) reference voltages;

a first switch array receiving and outputting $2^n$ selected reference voltages among the ($2^n$+1) reference voltages according to the first bit of input signal;

a second switch array receiving the $2^n$ selected reference voltages and outputting a first voltage of the selected reference voltages via a first output terminal and a second voltage of the selected reference voltages via a second output terminal according to the bits of input signal except for the first bit, wherein all (2i+1)th reference voltages are directly transmitted to the second switch array, and (2i+1) is the odd number between 0 and $2^n$; and a switch circuit to output the first voltage and the second voltage.

2. The converter as claimed in claim 1, wherein only one of the first reference and the $2^n$th reference voltages is transmitted to the second switch array according to the state of the first bit of the input signal.

3. The converter as claimed in claim 1, wherein when the first bit of the input signal is at a second voltage level, the first voltage is transmitted to the first output terminal, and the second voltage is transmitted to the second output terminal, and when the first bit of the input signal is at a first voltage level, the first voltage is transmitted to the second output terminal, and the second voltage is transmitted to the first output terminal.

4. The converter as claimed in claim 1, wherein the second switch array is a binary switch array.

5. The converter as claimed in claim 1, wherein the switch circuit further comprises:
   a first voltage output terminal coupled to the first output terminal of the second switch array;
   a second voltage output terminal coupled to the second output terminal of the second switch array;
   a first switch, coupled between the first output terminal and the first voltage output terminal;
   a second switch, coupled between the second output terminal and the second voltage output terminal;
   a third switch, coupled between the first output terminal and the second voltage output terminal; and
   a fourth switch, coupled between the second output terminal and the first voltage output terminal, wherein
   the first switch and the second switch are turned off when the first bit of the input signal is at the first voltage level, and the third switch and the fourth switch are turned on when the first bit of the input signal is at the first voltage level.

6. The converter as claimed in claim 5, wherein the first switch and the second switch are turned on when the first bit of the input signal is at a second voltage level, and the third switch and the fourth switch are turned off when the first bit of the input signal is at a second voltage level.

7. The converter as claimed in claim 1, wherein all (2i)th reference voltages are transmitted to the second switch array via one switch according to the first bit of input signal, and 2i is the even number between 0 and $2^n$.

8. A digital to analog converter with two outputs, controlled by an n-bits input signal, comprising:

a first output terminal and a second output terminal;
a reference voltage circuit generating ($2^n$+1) reference voltages;
a first digital to analog converting unit receiving (2i+1)th reference voltages and outputting a first voltage, wherein (2i+1) is the odd number between 0 and $2^n$;
a second digital to analog converting unit receiving the (2i)th reference voltages and outputting a second voltage, wherein 2i is the even number between 0 and $2^n$;
a switch circuit to direct the first voltage to the first output terminal or the second output terminal; and
the first digital to analog converting unit is controlled by the n-bits input signal except for a first bit of the n-bits input signal.

9. The converter as claimed in claim 8, wherein when the first bit of the input signal is at a first voltage level, the first voltage is transmitted to the second output terminal, and the second voltage is transmitted to the first output terminal.

10. The converter as claimed in claim 8, wherein when the first bit of the input signal is at a second voltage level, the first voltage is transmitted to the first output terminal, and the second voltage is transmitted to the second output terminal.

11. The converter as claimed in claim 8, wherein the switch circuit further comprises:
   a first input terminal coupled to the first output terminal;
   a second input terminal coupled to the second output terminal;
   a first voltage output terminal;
   a second voltage terminal;
   a first switch, coupled between the first output terminal and the first voltage output terminal;
   a second switch, coupled between the second output terminal and the second voltage output terminal;
   a third switch, coupled between the first output terminal and the second voltage output terminal; and
   a fourth switch, coupled between the second output terminal and the first voltage output terminal, wherein
   the first switch and the second switch are turned off when the first bit of the input signal is at the first voltage level, and the third switch and the fourth switch are turned on when the first bit of the input signal is at the first voltage level.

12. The converter as claimed in claim 11, wherein the first switch and the second switch are turned on when the first bit of the input signal is at a second voltage level, and the third switch and the fourth switch are turned off when the first bit of the input signal is at a second voltage level.

* * * * *